United States Patent
Sanganeria et al.

(10) Patent No.: US 6,972,252 B1
(45) Date of Patent: Dec. 6, 2005

(54) METHOD OF IMPROVING ADHESION BETWEEN TWO DIELECTRIC FILMS

(75) Inventors: Mahesh Sanganeria, Sunnyvale, CA (US); Bart van Schravendijk, Sunnyvale, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 10/647,773

(22) Filed: Aug. 25, 2003

(51) Int. Cl.$^7$ .............................................. H01L 21/44
(52) U.S. Cl. ...................... 438/624; 438/675; 438/677; 438/902
(58) Field of Search ................................ 438/628, 644, 438/654, 675, 677, 622, 902, 958, 778, 624

(56) References Cited

U.S. PATENT DOCUMENTS 6,472,335 B1 * 10/2002 Tsai et al. .................... 438/780
2004/0018748 A1 * 1/2004 Lu et al. ....................... 438/778
2004/0175929 A1 * 9/2004 Schmitt et al. .............. 438/628

* cited by examiner

Primary Examiner—Minh-Loan Tran
(74) Attorney, Agent, or Firm—DeLio & Peterson, LLC (57) ABSTRACT

A method of improving adhesion between layers in the formation of a semiconductor device and integrated circuit, and the resultant intermediate semiconductor structure, which include a substrate layer with a low k insulating layer thereover. The low k insulating layer includes a treated surface area of adsorbed gaseous particles. This treated surface area is formed by flowing a gas, preferably, silane, disilane, dichlorosilane, germane or combinations thereof, over a surface of the heated low k insulating layer for adsorption of such gaseous particles onto the heated surface, wherein the insulating layer maintains its original thickness. A capping layer is then deposited directly over the insulating layer wherein the treated surface area of the insulating layer significantly improves adhesion between the insulating layers and the capping layers to prevent delamination therebetween during subsequent processing steps of forming the integrated circuit.

25 Claims, 6 Drawing Sheets

METHOD OF IMPROVING ADHESION BETWEEN TWO DIELECTRIC FILMS

BACKGROUND OF THE INVENTION

1. Field of the Invention

The present invention relates to manufacturing of integrated circuits on semiconductor substrates and, in particular, to a method of improving adhesion between an insulating layer and a cap layer within such integrated circuits.

2. Description of Related Art

In semiconductor fabrication processes, layers of insulating, conducting and semiconductor materials are commonly deposited and patterned to form integrated circuits (IC). These multilayer electronic components may further be provided with contact vias and line wirings formed in the insulating materials of such ICs, which, are referred to as interlevel dielectrics (ILDs). Typically, ILDs are made by damascene and dual damascene processing techniques.

In damascene processing, multilayer electronic components are made by depositing a dielectric material on a surface of a substrate to form an insulating layer and then patterning the insulating layer to form openings for trenches therein such insulating layer. Once trenches are formed, a conductive material is deposited into the trenches and then any excess conductive material may be removed from the structure surface to form damascene regions within the insulator layer.

Dual damascene processing similarly involves etching trenches within the insulating layer of the IC and further etching vias at the bottom of these trenches. In ICs where contact vias also extend downwardly from the bottom of the trenches, both the trenches and the downwardly extending vias are simultaneously filled with conductive material. This process forms both contact vias and integrated wires for interconnecting electrical devices and wiring at various levels within the IC.

Thus, in the process of forming multilayer electronic components, using both damascene and dual damascene processes, several layers are required to form the contact vias and integrated wires. For example, a typical multilayer electronic component may be built up from a first insulating layer on a substrate by forming an opening therein and then filling the opening with a conductive fill material to form conductive lines. However, prior to metallization, a barrier layer is typically provided within the openings in the first insulating layer to avoid metal diffusion between the conductive fill and the first insulating layer.

A second insulating layer is deposited over the first insulating layer and the metallization. Trenches and contact vias are then formed in this second insulating layer to form the line wirings and contact vias of the multilayer electronic component. Again, prior to metallization, a barrier layer may be deposited into the trenches and vias so as to coat the sidewalls of the openings in order to prevent any metal diffusion. The trenches and vias are then filled with metallization and the surface area of the substrate planarized, such as, by chemical mechanical polishing.

However, during the polishing process, the barrier layer may delaminate from the insulating layer resulting in interruption of polishing process as well as damage to the multilayer electronic component. This delamination problem is particularly severe in those devices having low k dielectric constant insulating layers. One method to decrease the problem of delamination between low k dielectric constant insulating layers and barrier layers has been to deposit a cap layer between the insulating layer and the barrier layer. However, the use of cap layers is ineffective as delamination occurs between the insulating and cap layers, and in particular, between low k dielectric constant insulating layers and cap layers.

Therefore, a need exists in the art for preventing delamination between insulating layers and cap layers, particularly, those insulating and cap layers used in single and dual damascene processes.

SUMMARY OF THE INVENTION

Bearing in mind the problems and deficiencies of the prior art, it is therefore an object of the present invention to provide a method for preventing delamination between insulating layers and cap layers.

Another aspect of the invention is to provide a method for providing improved adhesion between insulating layers, preferably low k dielectric constant insulating layers, and cap layers in single and dual damascene processes.

It is another object of the present invention to provide uniquely modified damascene and dual damascene processes for fabricating multilayer electronic components.

Yet another aspect of the invention is to provide multilayer electronic components made using the method of the invention.

Still other objects and advantages of the invention will in part be obvious and will in part be apparent from the specification.

The above and other objects, which will be apparent to those skilled in the art, are achieved in the present invention, which, is directed to in a first aspect a method of improving adhesion between an insulating layer and a capping layer in a process for making electronic components.

The method includes providing an integrated circuit structure which is in the process of being fabricated into a finished electronic component having an insulating layer. An exposed surface of the insulating layer is contacted with a gas for adsorption of such gas onto the exposed surface to form a treated surface area of the insulating layer while simultaneously maintaining an original thickness of the insulating layer. A capping layer is deposited over the treated surface area and then the process of making the integrated circuit device continues, wherein the treated surface area improves adhesion between the insulating layers and the capping layer to prevent delamination therebetween during these subsequent processing steps.

Preferably, the insulating layer has a thickness ranging from about 2,000 Å to about 10,000 Å, and comprises a low k dielectric, such as, organo silicate glass, polyimide, organic siloxane polymer, polyarylene ether, nano-porous silica, hydrogen silesquioxane glass and methyl silesquioxane glass.

In this first aspect, the gas is preferably silane, disilane, dichlorosilane, germane and combinations thereof, whereby the adsorbed gaseous particles may include molecules, radicals, derivatives and combinations thereof. In adsorption of such gaseous particles onto the surface of the insulating layer, it is critical that the insulating layer and substrate be heated, preferably to a temperature ranging from about 100° C. to about 500° C. and then the gas is flown over these heated surfaces for adsorption thereon. This may be accomplished at a pressure ranging from about 0.5 Torr to about 10 Torr and for a duration of about 50 sccm to about 500 sccm.

In a second aspect, the invention is directed to a method of forming a semiconductor device by providing a substrate layer, depositing an insulating layer thereon and then heating the substrate layer and the insulating layer. Once heated, the treatment gas is flown over a surface of the heated insulating layer.

In so doing, this treatment gas contacts the heated surface for adsorption of the gas onto the surface of the insulating layer to form a treated surface area thereof while maintaining an original thickness of the insulating layer. A capping layer is then deposited directly over the insulating layer wherein the treated surface area of the insulating layer improves adhesion between the insulating and the capping layers to prevent delamination therebetween during subsequent processing steps.

In a third aspect, the invention is directed to an intermediate semiconductor structure. This intermediate semiconductor structure includes a substrate layer, an insulator layer disposed over the substrate layer having a treated surface area comprising adsorbed gaseous particles and a capping layer disposed over the treated surface area of the insulator layer. In accordance with the invention, the treated surface area of this intermediate structure advantageously prevents any delamination between the insulator layer and the capping layer.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 1–11 of the drawings in which like numerals refer to like features of the invention.

The present invention overcomes problems of delamination between a capping layer and an insulating layer in fabrication of a semiconductor device. Advantageously, the invention provides a method of forming a semiconductor device, and the semiconductor device fabricated using such method, that significantly improves adhesion between capping and insulator layers, which in turn, prevents any delamination from occurring between such layers during further processing of the semiconductor device, particularly during subsequent planarization processes. These steps may be repeated a number of times on the substrate to complete the fabrication of the semiconductor device. The invention will be better understood with reference to the drawings.

Figure 1:
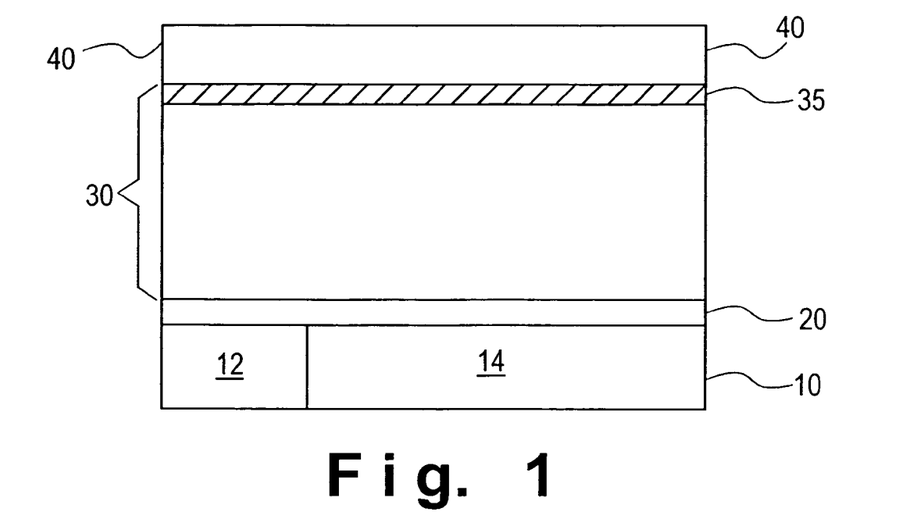
FIG. 1 is a cross-sectional view of a substrate processed in accordance with the invention having a treated surface area of an insulating layer.

Referring to FIG. 1, a substrate 10 is provided, which, preferably includes insulator regions 12 of a known insulator material and metal regions 14 fabricated by known techniques. The substrate 10 may comprise any known substrate material including, but not limited to, $Si_3N_4$, SiC, low k dielectric $SiO_2$, doped $SiO_2$. A first dielectric layer 20 is then deposited directly over the substrate 10. This first dielectric layer 20 may include a material, such as a low k dielectric constant interlevel dielectric material, SiC, SiN and the like, deposited to a thickness ranging from about 300 Å to about 800 Å by known techniques.

Next, an insulating layer 30 is deposited directly over the first dielectric layer 20 to a thickness ranging from about 2000 Å to about 10,000 Å also by known techniques. In accordance with the invention, the insulating layer 30 preferably comprises any known low k dielectric material including, but not limited to, CORAL™ of Novellus Systems, Inc., BLACK DIAMOND™ of Applied Materials, Inc., SiLK™ of Dow Corning, Inc., NANOGLASS ™ of Nanopore, Inc, and the like. Other low k dielectric materials used to form insulating layer 30 may include, for example, organo silicate glass, polyimide, organic siloxane polymer, polyarylene ether, methyle hydrogen, nano-porous silica, hydrogen silesquioxane glass and methyl silesquioxane glass.

Once the insulating layer 30 is deposited on the first dielectric layer 20, the surface area of insulating layer 30 is treated to form a treated surface area 35 of insulating layer 30 for improving adhesion between such insulating layer 30 and a subsequently deposited capping layer 40.

In forming the treated surface area 35 of insulating layer 30, once the insulating layer 30 is deposited, the structure is treated in a gaseous environment, within a treatment chamber, at an elevated temperature for a duration sufficient for adsorption of such gas particles, radicals, or derivatives thereof onto the exposed surface areas of the insulating layer 30. Preferably, the insulating layer 30 is treated in chemical vapor deposition chamber. In accordance with the invention, the treatment gas is continually flown into the treatment chamber over the exposed surface areas of insulating layer 30 during the formation of treated surface area 35. In so doing, the treated surface area 35 is formed only at exposed surface areas of insulating layer 30 whereby the insulating layer 30 maintains its original thickness. This, is a critical feature of the invention as the treated surface area 35 of insulating layer 30 improves adhesion between such insulating layer 30 and a subsequently deposited capping layer without requiring any additional height or architecture to the structure 10, 20, 30; particularly to insulating layer 30.

In more detail, in treating the insulating layer 30, the treatment chamber is preferably preheated and maintained at a temperature ranging from about 100° C. to about 500° C. The substrate having the insulating layer thereover is then provided within the preheated chamber and also heated to a predetermined temperature ranging from about 100° C. to about 500° C., preferably at about 400° C. The substrate 10, 20 having insulating layer 30, preferably of a low k dielectric insulating material, is maintained at this temperature during the formation of the treated surface area 35.

Once the structure is maintained at the predetermined temperature, the treatment gas is flown into the treatment chamber at a pressure ranging from about 0.5 Torr to about 10 Torr over the insulating layer 30 while maintaining the structure at the predetermined temperature. The treatment gas preferably comprises a silane-based or germanium-based gas, such as, silane, disilane, dichlorosilane, germane, and combinations thereof. In accordance with the invention, it is critical that the treatment gas be a reactive in nature, such as, those used for film depositions.

In the preferred embodiment the treatment gas comprises silane gas flown over surfaces of a low k insulating layer 30. The gas is continually flown into the treatment chamber over the insulating layer 30 for a sufficient duration that allows the adsorption of the gaseous particles, radicals or derivatives onto the exposed surfaces of insulating layer 30 to form the treated surface area 35. Preferably, the gas is continually flown into the treatment chamber over exposed surfaces of insulating layer 30 for a time ranging from about 50 sccm to about 500 sccm.

Subsequently, the adsorbed gaseous particles, molecules, radicals or derivatives of the treated surface area 35 may then optionally undergo an oxidation or carbonization process. This may be accomplished by flowing an oxygen-based gas or carbon-based gas including, but not limited to, $CH_4$, $CO_2$, $O_2$ or combinations thereof, over the treated surface area 35 in order to oxidize and/or carbonize the adsorbed gases of the treated surface area 35. The nitridization or carbonization process can be performed using a plasma process with a power in the range of about 100 W to about 1000 W.

Once the treated surface area 35 of insulating layer 30 is formed, and optionally oxidized and/or carbonized, a capping layer 40 is provided directly and entirely over this treated surface area 35, whereby the treated surface area 35 of the invention significantly improves adhesion between it and the capping layer 40. The capping layer 40 may comprise a material including, but not limited to, silicon oxide, silicon carbide, silicon nitride, and the like, deposited by known techniques to a thickness ranging from about 2 nm to about 100 nm.

Figure 2:
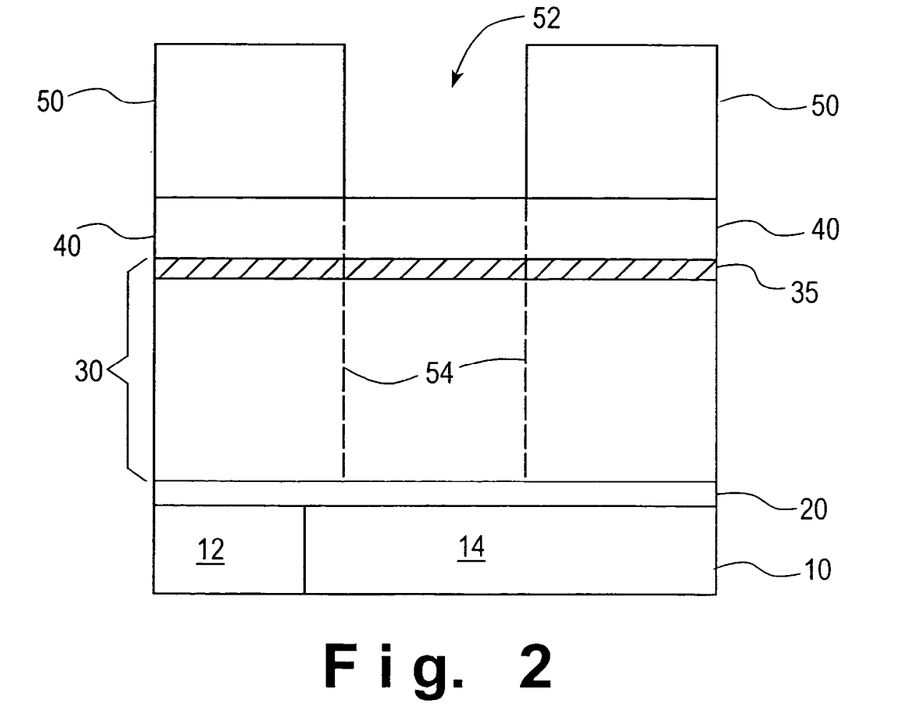
FIG. 2 is a cross-sectional view of the structure of FIG. 1 showing the step of forming openings in a mask over a surface of a capping layer.

Referring to FIG. 2, once the capping layer 40 is deposited over the treated surface 35 of insulating layer 30 the structure is further processed, wherein during such subsequent processing steps the improved adhesion between the insulating layer 30 and the capping layer 40 as a result of treated surface area 35 substantially prevents any delamination from occurring between such layers during these further processing steps.

In accordance with the invention, the semiconductor device is further processed by forming mask 50 over a surface of capping layer 40 by a known technique. As shown in FIG. 2, the mask 50 is patterned and exposed, preferably via lithography, to form openings 52 therein mask 50. Referring to the dashed lines 54 in FIG. 2, the openings 52 of mask 50 are then transferred into the underlying substrate.

Figure 3:
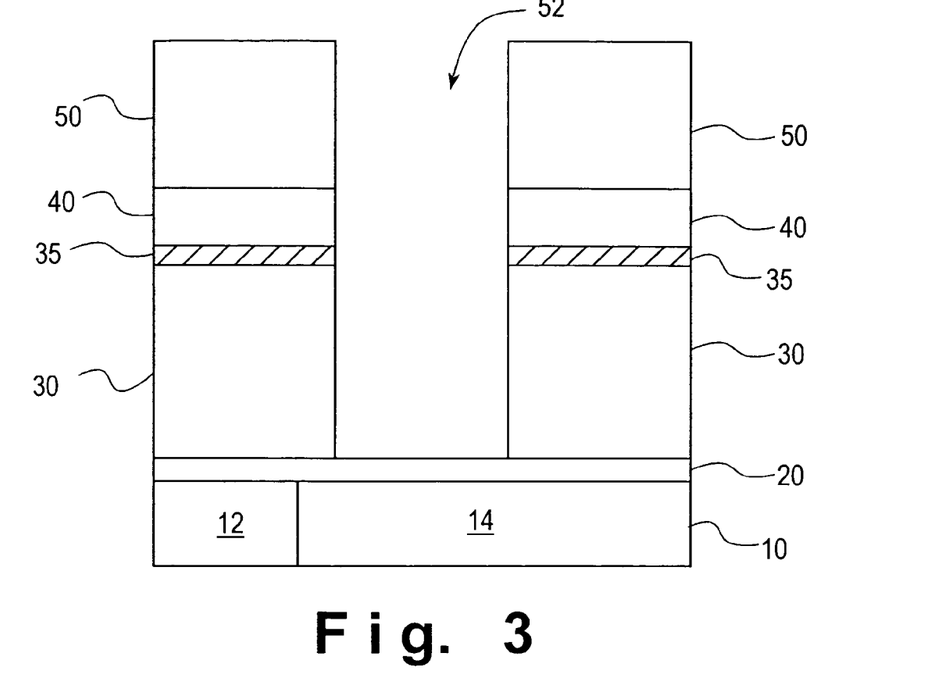
FIG. 3 is a cross-sectional view of the structure of FIG. 2 showing the step of transferring the openings of the mask into the underlying structure to form openings therein with exposed surfaces of a dielectric layer.
Figure 4:
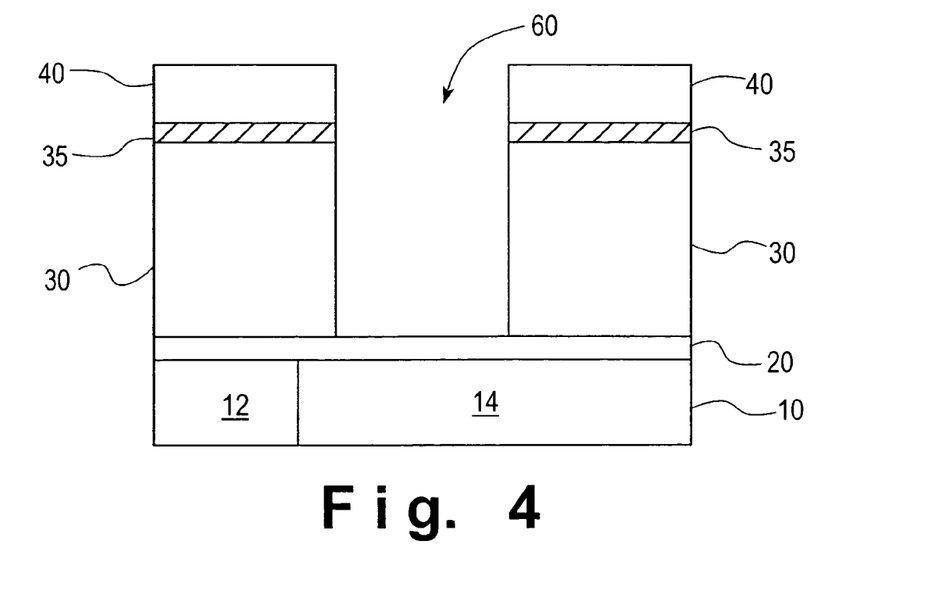
FIG. 4 is a cross-sectional view showing the step of removing the mask of FIGS. 3 and 4.

Referring to FIGS. 3 and 4, openings 52 of mask 50 are transferred into the underlying structure by etching through correlating regions of sequentially exposed capping layer 40, treated area 35 and the insulating layer 30, stopping at a top surface of the first dielectric layer 20 to form openings 60. Remaining portions of mask 50 are then removed, preferably by a photo resist dry stripping technique, to expose a top surface of the capping layer 40 as shown in FIG. 4. The exposed surface areas of this resultant structure as shown in FIG. 4 are then cleaned, preferably via a wet clean technique.

Figure 5:
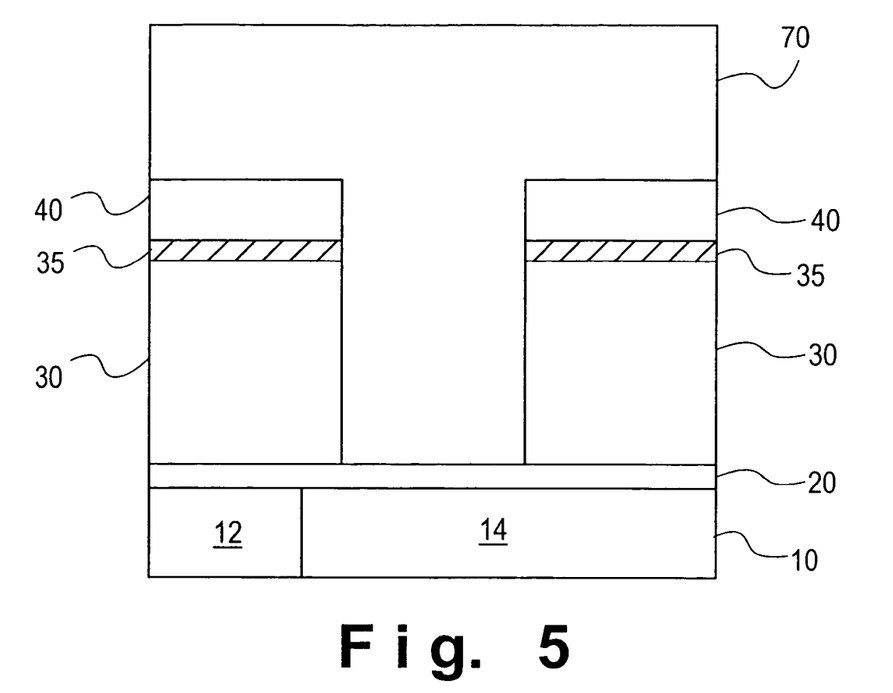
FIG. 5 is a cross-sectional view of the structure of FIG. 4 showing the step of filling the openings with a photo resist material.
Figure 6:
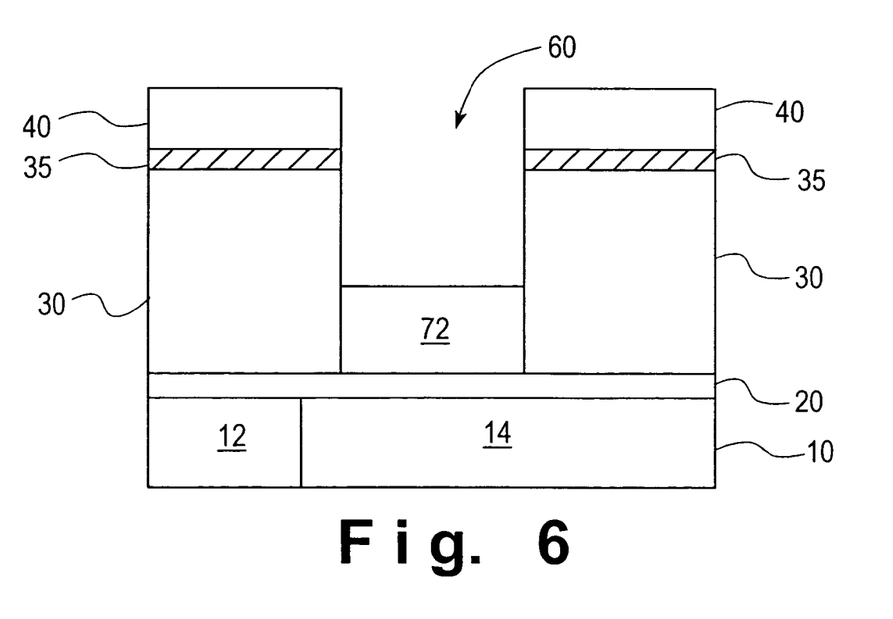
FIG. 6 is a cross-sectional view of the structure of FIG. 5 showing the step of recessing back the photo resist material to form a photo resist plug within each of the openings in the structure.

Once the surfaces of the intermediate structure are cleaned, a photo resist layer 70 is deposited over the structure surface in an amount sufficient to at least fill the openings 60 as shown in FIG. 5. Preferably, the photo resist layer 70 may be deposited by an I-line resist coating technique. The photo resist layer 70 is then etched back to a sufficient depth so as to leave remaining portions of photo resist layer within openings or vias 60. Referring to FIG. 6, the photo resist layer 70 is preferably etched back so as to leave remaining photo resist plugs 72 within vias 60 whereby the capping layer 40 remains exposed at a surface of this resultant intermediate structure. This may be accomplished by an I-line resist etch technique.

Figure 7:
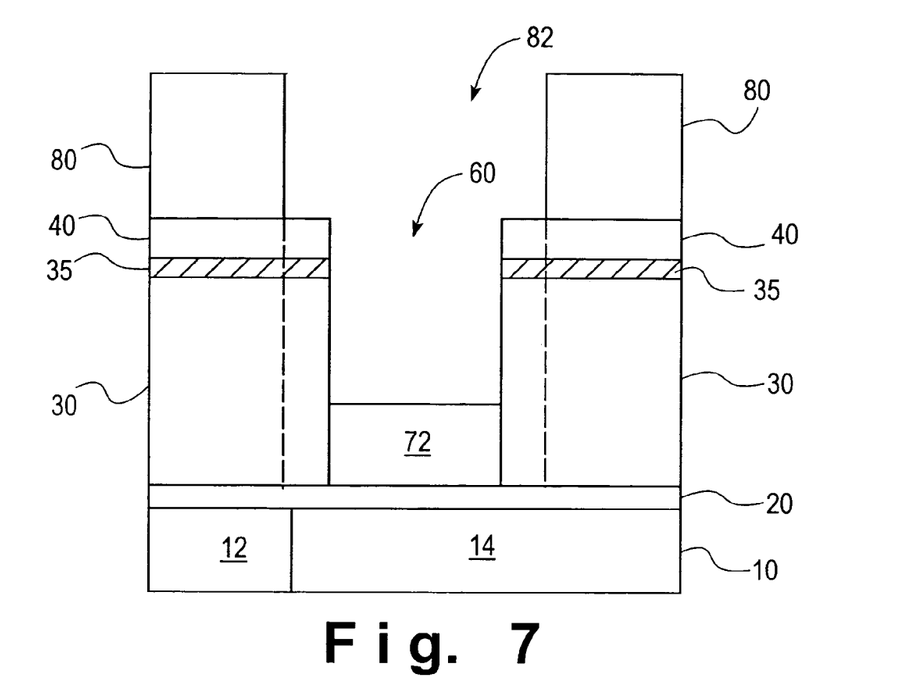
FIG. 7 is a cross-sectional view of the step of forming a second mask over the structure of FIG. 6 for forming trenches within such intermediate semiconductor structure.

The structure of FIG. 6 may be further processed in accordance with the present dual damascene processing technique. In so doing, a second mask 80 is formed over the structure as shown in FIG. 6 by initially depositing a photo resist material over the surface followed by patterning and exposing such resist layer, preferably via lithography, to form openings 82 as shown in FIG. 7.

Figure 8:
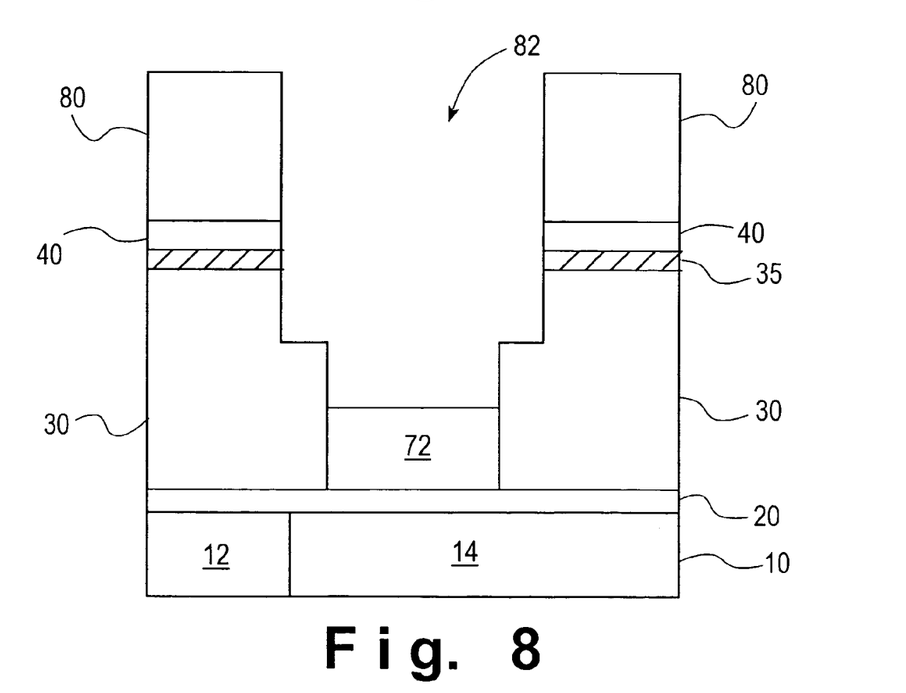
FIG. 8 is a cross-sectional view of the step of forming such trenches within such intermediate semiconductor structure of FIG. 7.

Openings 82 are used to form trenches within the semiconductor structure. In so doing, the openings 82 are formed directly over locations of openings 60. In accordance with the invention, these openings 82 may be the same size as openings 60, or alternatively as shown in FIG. 7, these openings 82 may be larger in dimension in comparison to openings 60. As shown by the dashed lines in FIG. 7, the openings 82 are transferred into the remaining portions of underlying capping layer 40, treated surface 35 and insulating layer 30 by etching there-through such layers stopping at a distance within the insulating layer 30 as shown in FIG. 8. This may be accomplished by line etching these layers to a depth ranging from about 2,000 Å to about 5,000 Å.

Figure 9:
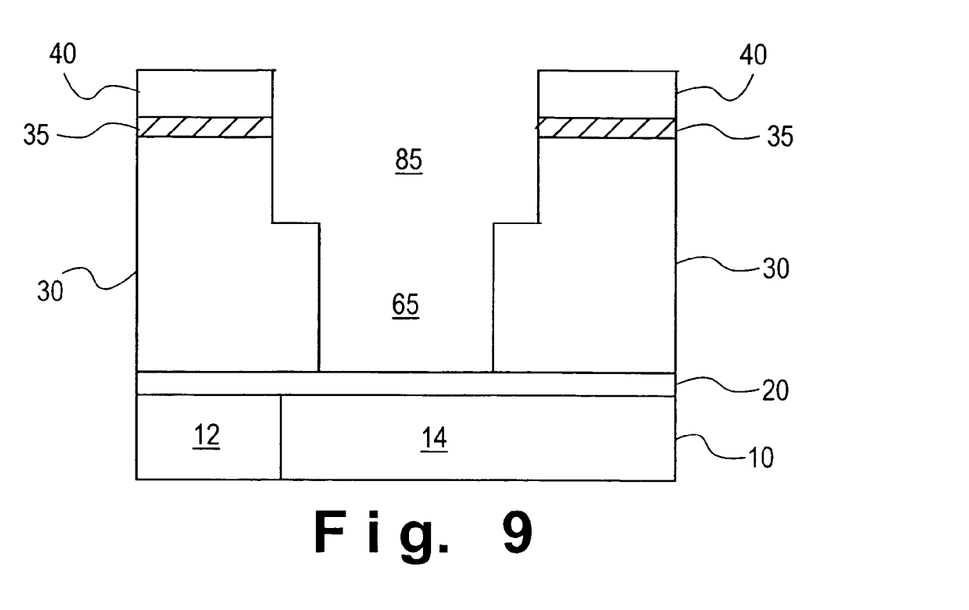
FIG. 9 is a cross-sectional view of the structure of FIG. 8 showing the step of removing the second mask, the photo resist plug within each via, as well as the exposed dielectric layer within each via.

Referring to FIG. 9, once openings 82 are transferred into the underlying structure, the second mask 80 is removed, preferably by a photo resist dry strip process, therein exposing a top surface of the capping layer 40 and removing any photo resist plug 72 remaining within vias 60, as well as any subsequently exposed regions of the first dielectric layer 20 at the bottom of vias 60. The resultant structure is cleaned, preferably via a wet clean process, to form trench 85 openings overlying via 65 openings and having exposed regions of the metal region 14 of the substrate 10. Subsequently, the structure of FIG. 9 may be provided with metallization layers whereby the treated surface area 35 prevents delamination between the insulating layer 30 and the capping layer 40 during such processing steps.

Figure 10:
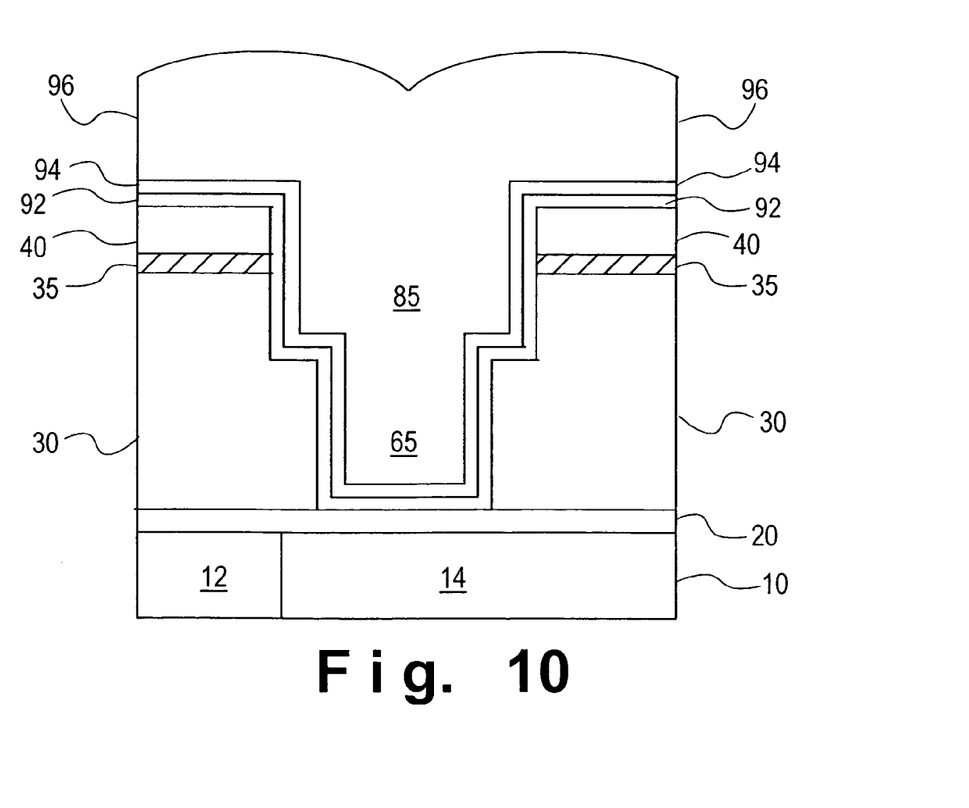
FIG. 10 is a cross-sectional view showing the step of forming metallization layers within the trenches and vias of the structure of FIG. 9.

Referring to FIG. 10, the exposed surfaces of the structure are cleaned and then a barrier layer 92 is deposited entirely over all exposed surfaces of the structure whereby the barrier layer 92 directly contacts the exposed metal portions 14 of the substrate at the bottom of via 65 openings. The barrier layer may include a known refractory metal (Ta, Ti, W), refractory metal nitrides (TaN, TiN, WN), refractory metal alloys (TaSiN), or combinations thereof deposited to a thickness of about 2 nm to about 100 nm by known techniques, such as, by physical vapor deposition. Once the barrier layer 92 is deposited, a seed layer 94 may be deposited directly and entirely over the barrier layer 92. The seed layer 94 may comprise a copper seed layer also deposited to a thickness ranging from about 500 Å to about 2000 Å by known techniques, such as, sputtering and chemical vapor deposition.

After the barrier layer 92 and the seed layers 94 are deposited, remaining portions within vias 65 and trenches 85 are filled with a conductive material 96. The conductive material of this metallization layer 96 may comprise a metal. Preferably, the metallization layer is a copper electrofill layer, which once deposited, is subjected to a known annealing technique.

Figure 11:
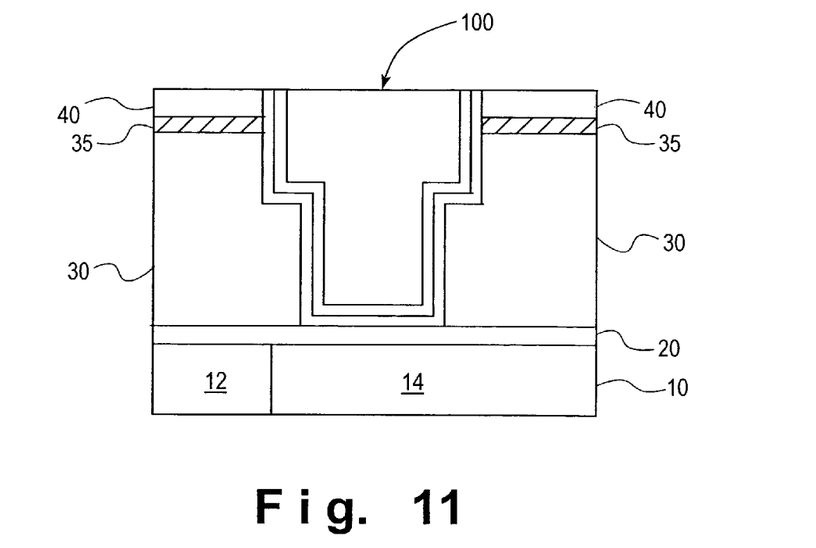
FIG. 11 is a cross-sectional view showing the step of planarizing the structure of FIG. 10 whereby in accordance with the invention the treated surface area of the insulating layer significantly prevents any delamination from occurring between such insulating layer and a capping layer directly thereover.

Upon completion of deposition of the metallization layer 96, the surface of the structure of FIG. 10 is planarized whereby the capping layer 40 may be removed, may be partially removed, or alternatively may remain on the surface of the substrate. This planarization step forms conductive features 100 that isolated from adjacent conductive features via insulating layer 30. The planarization may be accomplished by known chemical mechanical polishing techniques such as, for example, an abrasive-free polishing technique. Subsequently, the seed layer and the barrier layers are planarized to expose surfaces of the capping layer 40 as shown in FIG. 11. This too may be accomplished by known chemical mechanical polishing techniques. During this planarization process, a critical feature of the invention is that the treated surface area 35 of the low k insulating layer 30 substantially prevents any delamination from occurring between such low k dielectric constant insulating layer 30 and the overlying capping layer 40.

As will be understood in accordance with the invention, the instant method may be used to form a variety of semiconductor surfaces requiring strong adhesion between an insulating layer, particularly a low k dielectric insulating layer, and an overlying capping layer, particularly an oxide layer. These semiconductor surfaces include, but are not limited to, planarized multi-level metal interconnect structures, planarized shallow trench isolation structures, planarized semiconductor islands, and a variety of other surfaces as known and used in the art.

For example, the invention is useful in fabricating integrated circuits that require the use of a trench etch stop layer. In these circuits, a first dielectric layer is deposited over the substrate. Exposed surface areas of this first dielectric layer are then provided with the treated surface area of the invention by flowing a gas over the surface for adsorption of such gaseous particles onto the exposed surfaces of the first dielectric. After this treatment step, an etch stop layer is directly deposited over the treated surface area of the insulating dielectric layer whereby the treated surface improves adhesion between the etch stop layer and the treated first dielectric layer. The etch stop layer may comprise a trench etch stop layer comprising a material including but not limited to a SiN, SiC and the like.

Subsequently, exposed surface areas of the etch stop layer may also undergo the treatment process of the invention to form treated surface areas of the etch stop for improving adhesion between such etch stop layer and a subsequently deposited second dielectric layer. The improved adhesion is a result of the adsorbed gaseous particles on the surface of the etch stop layer. This second dielectric layer over the etch stop layer may also be subjected to the treatment process of the invention to form adsorbed gaseous particles on the surface of the second dielectric layer. These adsorbed gaseous particles on the second dielectric layer improve adhesion between this second dielectric layer and a subsequently deposited capping layer.

Thus, in accordance with the present invention, an essential feature is that the treated surface area 35 comprising adsorbed gaseous particles on surfaces of the insulating layer significantly improves adhesion between such insulating layer and another layer deposited directly over the treated surface area, which in turn, eliminates delamination from occurring between such layers during further processing of the integrated circuit, particularly during planarization processes.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of improving adhesion between an insulating layer and a capping layer in a process for making electronic components comprising:
    providing an integrated circuit structure which is in the process of being fabricated into a finished electronic component having an insulating layer;
    contacting an exposed surface of said insulating layer with a gas selected from the group consisting of silane, disilane, dichlorosilane, germane and combinations thereof for adsorption of said gas onto said exposed surface of said insulating layer to form a treated surface area of said insulating layer while maintaining an original thickness of said insulating layer;
    depositing a capping layer directly over said treated surface area of said insulating layer; and
    continuing the process for making the integrated circuit device,
wherein said treated surface area of said insulating layer improves adhesion between said insulating layer and said capping layer to prevent delamination therebetween during said step of continuing the process for making the integrated circuit device.

2. The method of claim 1 wherein said insulating layer has a thickness ranging from about 2,000 Å to about 10,000 Å.

3. The method of claim 1 wherein said insulating layer comprises a low k dielectric.

4. The method of claim 3 wherein said low k dielectric comprises a material selected from the group consisting of organo silicate glass, polyimide, organic siloxane polymer, polyarylene ether, methyl hydrogen, nano-porous silica, hydrogen silesquioxane glass and methyl silesquioxane glass.

5. The method of claim 1 wherein said adsorbed gaseous particles selected from the group consisting of molecules, radicals, derivatives and combinations thereof of said gas are adsorbed onto said exposed surface of said insulating layer to form said treated surface area.

6. The method of claim 5 wherein said adsorbed gaseous particles are adsorbed onto said exposed surface of said insulating layer by heating said integrated circuit having said insulting layer to a temperature ranging from about 100° C. to about 500° C. and then flowing said gas over said exposed surface of said heated insulating layer.

7. The method of claim 6 wherein said gas is flown over said exposed surface of said heated insulating layer at a pressure ranging from about 0.5 Torr to about 10 Torr for a duration of about 50 sccm to about 500 sccm.

8. A method of forming a semiconductor device comprising:
providing a substrate layer;
depositing an insulating layer over said substrate layer;
heating said substrate layer and said insulating layer;
flowing a treatment gas selected from the group consisting of silane, disilane, dichlorosilane, germane and combinations thereof over a surface of said heated insulating layer;
contacting said surface of said heated insulating layer with said treatment gas for adsorption of said gas onto said surface of said insulating layer to form a treated surface area of said insulating layer while maintaining an original thickness of said insulating layer; and
depositing a capping layer directly over said insulating layer wherein said treated surface area of said insulating layer improves adhesion between said insulating and said capping layers to prevent delamination therebetween during subsequent processing steps.

9. The method of claim 8 further including the step of depositing a dielectric layer over said substrate layer followed by depositing said insulating layer over said dielectric layer.

10. The method of claim 9 wherein said dielectric layer is deposited to a thickness ranging from about 300 Å to about 800 Å.

11. The method of claim 8 wherein said insulating layer comprises a low k dielectric selected from the group consisting of organo silicate glass, polyimide, organic siloxane polymer, polyarylene ether, methyl hydrogen, nano-porous silica, hydrogen silesquioxane glass and methyl silesquioxane glass.

12. The method of claim 11 wherein said insulating layer is deposited to a thickness ranging from about 2,000 Å to about 10,000 Å.

13. The method of claim 8 wherein said substrate layer and said insulating layer are heated and maintained at a temperature ranging from about 100° C. to about 500° C.

14. The method of claim 8 wherein said adsorption of said gas onto said surface of said insulating layer comprises adsorbed gas particles selected from the group consisting of gaseous molecules, radicals, derivatives thereof and combinations thereof.

15. The method of claim 8 wherein said treatment gas is flown over said surface of said heated insulating layer at a pressure ranging from about 0.5 Torr to about 10 Torr.

16. The method of claim 15 wherein said treatment gas is flown over said surface of said heated insulating layer for a duration of about 50 sccm to about 500 sccm.

17. The method of claim 8 wherein said capping layer is selected from the group consisting of silicon oxide, silicon carbide and silicon nitride.

18. The method of claim 8 wherein said subsequent processing steps, further including the steps of:
forming a first set of openings in a first mask deposited over said capping layer;
transferring said first set of openings into said insulator layer to form via openings in said insulator layer;
depositing photo resist in an amount sufficient to at least fill said via openings in said insulator layer; and
etching back said photo resist so as to leave remaining portions of said photo resist only within said via openings to form photo resist plugs in said insulator layer.

19. The method of claim 18 further including the subsequent steps of:
forming a second set of openings in a second deposited mask directly over said via openings;
transferring said second set of openings into said insulator layer to form trench openings over said via openings in said insulator layer;
removing said photo resist plugs to expose a metal region of said substrate layer;
depositing a metallization layer in an amount sufficient to at least fill said via openings and said trench openings; and
planarizing a surface of the semiconductor device wherein said treated surface area of said insulting layer prevents delamination between said insulating layer and said capping layer.

20. A method of forming a semiconductor device comprising:
providing a substrate layer;
depositing an insulating layer over said substrate layer;
heating said substrate layer and said insulating layer;
flowing a treatment gas over a surface of said heated insulating layer;
contacting said surface of said heated insulating layer with said treatment gas for adsorption of said gas onto said surface of said insulating layer to form a treated surface area of said insulating layer while maintaining an original thickness of said insulating layer;
oxidizing said treated surface area of said insulating layer; and
depositing a capping layer directly over said insulating layer wherein said treated surface area of said insulating layer improves adhesion between said insulating and said capping layers to prevent delamination therebetween during subsequent processing steps.

21. The method of claim 20 wherein said treatment gas is a silane-based gas.

22. The method of claim 20 wherein said treatment gas is a germanium-based gas.

23. A method of forming a semiconductor device comprising:
providing a substrate layer;
depositing an insulating layer over said substrate layer;
heating said substrate layer and said insulating layer;
flowing a treatment gas over a surface of said heated insulating layer;
contacting said surface of said heated insulating layer with said treatment gas for adsorption of said gas onto said surface of said insulating layer to form a treated surface area of said insulating layer while maintaining an original thickness of said insulating layer;
carbonizing said treated surface area of said insulating layer; and
depositing a capping layer directly over said insulating layer wherein said treated surface area of said insulating layer improves adhesion between said insulating and said capping layers to prevent delamination therebetween during subsequent processing steps.

24. The method of claim 23 wherein said treatment gas is a silane-based gas.

25. The method of claim 23 wherein said treatment gas is a germanium-based gas.

* * * * *